United States Patent
Nam et al.

(10) Patent No.: US 10,790,677 B2
(45) Date of Patent: Sep. 29, 2020

(54) BATTERY CELL BALANCING METHOD AND SYSTEM

(71) Applicant: LG CHEM, LTD., Seoul (KR)

(72) Inventors: Ho Chol Nam, Cheongju-Si (KR); Seog Jin Yoon, Cheongju-Si (KR); Dong Hyun Kim, Sejong (KR); Hak In Kim, Cheongju-Si (KR)

(73) Assignee: LG CHEM, LTD., Seoul (KR)

( * ) Notice: Subject to any disclaimer, the term of this patent is extended or adjusted under 35 U.S.C. 154(b) by 311 days.

(21) Appl. No.: 15/764,463

(22) PCT Filed: Mar. 21, 2017

(86) PCT No.: PCT/KR2017/003013
§ 371 (c)(1),
(2) Date: Mar. 29, 2018

(87) PCT Pub. No.: WO2018/012706
PCT Pub. Date: Jan. 18, 2018

(65) Prior Publication Data
US 2018/0269694 A1    Sep. 20, 2018

(30) Foreign Application Priority Data

Jul. 12, 2016    (KR) .................. 10-2016-0087959

(51) Int. Cl.
*H01M 10/44*    (2006.01)
*H01M 10/46*    (2006.01)
(Continued)

(52) U.S. Cl.
CPC .......... *H02J 7/0016* (2013.01); *G01R 31/396* (2019.01); *G08B 21/18* (2013.01); (Continued)

(58) Field of Classification Search
CPC ....... H02J 7/1423; H02J 7/0013; H02J 7/0014
(Continued)

(56) References Cited

U.S. PATENT DOCUMENTS 5,656,915 A * 8/1997 Eaves ................. H01M 10/482
320/118
7,619,417 B2    11/2009 Klang
(Continued)

FOREIGN PATENT DOCUMENTS

CN    101794921 A    8/2010
CN    104052087 A    9/2014
(Continued)

OTHER PUBLICATIONS

Extended European Search Report for European Application No. 17827780.2, dated Aug. 8, 2018.
(Continued)

*Primary Examiner* — Edward Tso
(74) *Attorney, Agent, or Firm* — Birch, Stewart, Kolasch & Birch, LLP

(57) ABSTRACT

The present disclosure relates to a method and system for stabilizing a battery through cell balancing of a battery pack, and more particularly, to a method and system for performing battery cell balancing and determining a control situation through a feedback for the cell balancing, thereby improving reliability for the battery cell balancing and enabling a proactive measure for a battery abnormality.

8 Claims, 4 Drawing Sheets

(51) Int. Cl.
*H02J 7/00* (2006.01)
*G01R 31/396* (2019.01)
*H01M 10/42* (2006.01)
*G08B 21/18* (2006.01)
*G01R 19/165* (2006.01)

(52) U.S. Cl.
CPC ......... *H01M 10/42* (2013.01); *H01M 10/441* (2013.01); *H02J 7/00* (2013.01); *H02J 7/0014* (2013.01); *H02J 7/0021* (2013.01); *G01R 19/16542* (2013.01)

(58) Field of Classification Search
USPC .......................................... 320/116, 118, 119
See application file for complete search history.

(56) References Cited

U.S. PATENT DOCUMENTS

| | | |
|---|---|---|
| 8,896,315 B1 | 11/2014 | Davies |
| 2006/0119319 A1 | 6/2006 | Sakurai et al. |
| 2007/0194791 A1 | 8/2007 | Huang |
| 2010/0085009 A1 | 4/2010 | Kang et al. |
| 2011/0254502 A1 | 10/2011 | Yount et al. |
| 2011/0285538 A1 | 11/2011 | Lee et al. |
| 2012/0306506 A1 | 12/2012 | Kiuchi |
| 2013/0297237 A1 | 11/2013 | Ramos et al. |
| 2014/0253135 A1 | 9/2014 | Eguchi et al. |
| 2015/0349550 A1 | 12/2015 | Jeon |
| 2016/0141894 A1 | 5/2016 | Beaston |
| 2017/0214256 A1* | 7/2017 | Hardy .................... B60L 58/22 |

FOREIGN PATENT DOCUMENTS

| | | |
|---|---|---|
| EP | 2083494 A1 | 7/2009 |
| JP | 2006-166615 A | 6/2006 |
| JP | 2009-124933 A | 6/2009 |
| JP | 2010-35337 A | 2/2010 |
| JP | 2015-23727 A | 2/2015 |
| KR | 10-2013-0020946 A | 3/2013 |
| KR | 10-2015-0137675 A | 12/2015 |
| KR | 10-1610923 B1 | 4/2016 |
| TW | 200733455 A | 9/2007 |
| TW | 201624817 A | 7/2016 |

OTHER PUBLICATIONS

International Search Report for PCT/KR2017/003013 dated Jun. 14, 2017.

* cited by examiner

BATTERY CELL BALANCING METHOD AND SYSTEM

BACKGROUND

The present disclosure relates to a method and system for stabilizing a battery through cell balancing of a battery pack, and more particularly, to a method and system for performing battery cell balancing and determining a control situation through a feedback for the cell balancing, thereby improving reliability for the battery cell balancing and enabling a proactive measure for a battery abnormality.

Typically, a battery pack mounted on a device, such as an energy storage device, an electric vehicle, or a mobile electronic device, which requires a rechargeable electric storage device, includes a plurality of battery cells connected in series or in parallel. When the battery pack including the plurality of battery packs is discharged, the charge state difference occurs between the cells due to a self discharge rate as time passes. When the discharge of the battery pack is continued in a state where there is an imbalance in the charge state, a specific cell of which a charge state is low is over-discharged and the battery pack hardly operates stably. In addition, a case where the specific cell is over-charged in a charging process is also a cause of disturbing a stable operation of the battery pack. The overcharge or over-discharge of the specific battery cell, which occurs like this, may cause limitations of degrading the battery pack and shortening the life as well as reducing a capacity of the battery pack.

Accordingly, as a method for efficiently managing the battery pack, the battery cell balancing is an important process in which voltage differences between battery cells forming the battery pack are adjusted to be within a prescribed allowable range or to be equal to each other.

As a typical cell balancing manner, there is a first manner in which a balancing target cell is selected and balancing is performed thereon for a prescribed time, when a change in open-circuit voltage of a battery cell with respect to a charge state of the battery cell is equal to or greater than a reference value. There is a second typical manner in which, during a balancing control operation of the battery cell, a voltage of each battery cell is monitored in real time to determine completion of the balancing operation. In addition, there is a third typical manner in which respective voltages of the battery cells are measured, one of the measured voltages is set to a reference voltage, and balancing is performed through charging/discharging according to the reference voltage.

However, there is a limitation in that it is difficult to check a balancing performance result of the battery cell with the first to third typical manners. There is also a limitation in the second typical manner in that information about an abnormal battery situation that may occur after the balancing control may not be checked.

SUMMARY

The present disclosure provides a battery cell balancing method and system.

In accordance with an exemplary embodiment, a battery cell balancing method for balancing voltages of battery cells forming at least two or more battery banks included in a battery pack, includes: an entry condition checking operation of checking a cell balancing entry condition; a battery bank detecting operation of detecting a battery bank requiring cell balancing; a cell balancing start operation of starting the cell balancing; a start time voltage deviation recording operation of recording a voltage deviation of battery cells included in the battery bank detected to require the cell balancing; a cell balancing performing operation of performing the cell balancing; and a cell balancing terminating operation of terminating the cell balancing, wherein the cell balancing terminating operation includes: a termination time voltage deviation recording operation of recording a voltage deviation of the battery cells in the battery bank after the termination of the cell balancing; a voltage deviation comparing operation of comparing the voltage deviation of the battery cells recorded in the start time voltage deviation recording operation and the voltage deviation of the battery cells after the termination of the cell balancing; and a result checking operation of checking a result of the cell balancing.

The entry condition checking operation may be performed such that when the battery cells are in a charge state, the entry condition is satisfied, and when the battery cells are not in the charge state, the entry condition is not satisfied.

The battery bank detecting operation may be performed such that when the voltage deviation of the battery cells forming the battery bank is equal to or greater than a prescribed reference voltage deviation, it is determined that the cell balancing is necessary.

The cell balancing terminating operation may be performed when the voltage deviation of the battery cells forming the battery bank is equal to or smaller than a prescribed reference voltage deviation.

The result checking operation may be performed by determining that the cell balancing fails, when the voltage deviation at the cell balancing start time is equal to or smaller than the voltage deviation at the termination time, and by including a notification generating operation of generating a notification and recording a value, which may be a Robust Multi-array Average (RMA) for which a uniformly amplified output is represented by a magnitude, when the cell balancing is determined to fail.

In accordance with another exemplary embodiment, a battery cell balancing system for balancing voltages of battery cells included in at least two or more battery banks included in a battery pack, includes: the battery pack including the plurality of battery cells; and a battery managing unit configured to manage battery cell balancing, wherein the battery managing unit includes: an entry condition checking unit configured to check a cell balancing entry condition; a detecting unit configured to detect a battery bank requiring cell balancing; a memory unit in which a voltage deviation of battery cells in the battery bank at a start time of and after termination of the cell balancing are recorded and stored; a comparing and determining unit configured to compare the voltage deviations stored in the memory unit to check a result of the cell balancing; and a notifying unit configured to generate a notification according to the cell balancing result from the comparing and determining unit.

The comparing and determining unit may compare the voltage deviation at the cell balancing start time and the voltage deviation after the cell balancing termination stored in the memory unit, and determine that the cell balancing fails, when the voltage deviation at the cell balancing start time is smaller or equal to the deviation after the cell balancing termination.

The memory unit may further include a value that a uniformly amplified output is represented by a magnitude.

The notifying unit may generate a notification when it is determined that the cell balancing fails by the comparing and determining unit.

The voltage deviation may be a difference between a maximum voltage and a minimum voltage of the battery cells forming the battery bank.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
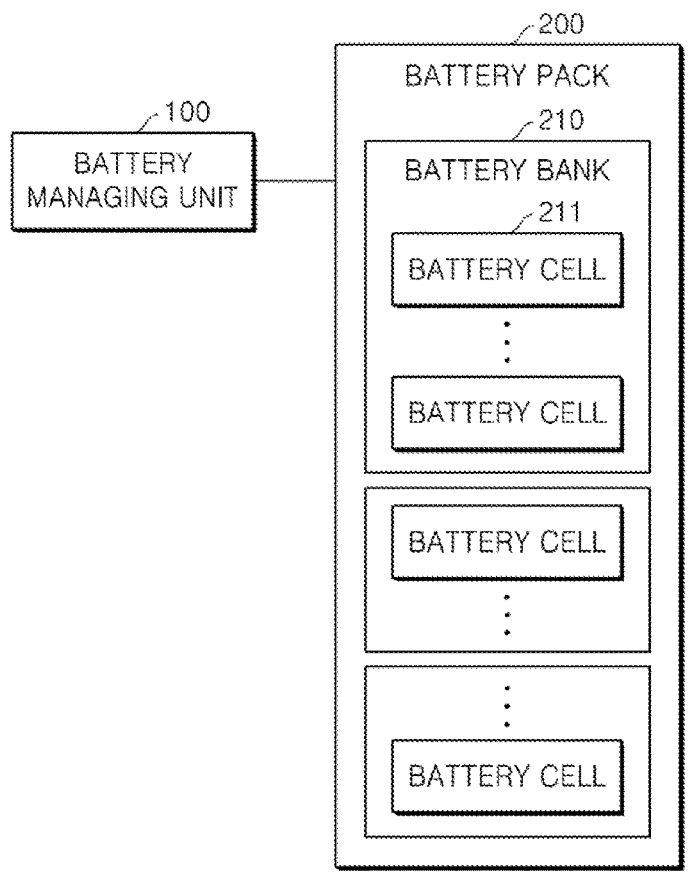
FIG. 1 is a block configuration diagram schematically illustrating a system configuration for balancing battery cells in accordance with an exemplary embodiment.

Hereinafter, embodiments of the present invention will be described in detail with reference to the accompanying drawings so that the present invention can be easily realized by those skilled in the art. The present invention can be practiced in various ways and is not limited to the embodiments described herein. In the drawings, parts which are not related to the description are omitted to clearly set forth the present invention and similar elements are denoted by similar reference symbols throughout the specification.

In addition, if certain parts are described as being "connected" to other parts, they are not only "directly connected" to the other parts, but also "indirectly connected" to the other parts with any other device intervened therebetween. In addition, when an element is referred to as "comprising" or "including" a component, it does not preclude another component but may further include the other component unless the context clearly indicates otherwise. Terms "operation of" used in the entirety of the present specification does not mean "operation for"

According to the present disclosure, a battery cell balancing method for balancing voltages of battery cells forming at least two or more battery banks included in a battery pack includes:

an entry condition checking operation of checking a cell balancing entry condition;

a battery bank detecting operation of detecting a battery bank requiring cell balancing;

a cell balancing start operation of starting the cell balancing;

a start time voltage deviation recording operation of recording a voltage deviation of battery cells comprised in the battery bank detected to require the cell balancing;

a cell balancing performing operation of performing the cell balancing; and a cell balancing terminating operation of terminating the cell balancing, wherein the cell balancing terminating operation includes:

a termination time voltage deviation recording operation of recording a voltage deviation of battery cells in the battery bank after the termination of the cell balancing;

a voltage deviation comparing operation of comparing a voltage deviation of the battery cell recorded in the start time voltage deviation recording operation and a voltage deviation of the battery cells after the termination of the cell balancing; and a result checking operation of checking a result of the cell balancing.

Hereinafter, specific embodiments will be described in detail with reference to the accompanying drawings.

FIG. 1 is a block configuration diagram schematically illustrating a system configuration for balancing battery cells according to an embodiment of the present disclosure.

Referring to FIG. 1, a system for balancing battery cells according to an embodiment of the present disclosure includes a battery managing unit 100 and a battery pack 200.

The battery pack 200 includes at least two or more battery banks 210. The battery pack includes battery cells 211 connected in series or in parallel, and the battery cells 211 are connected to form one battery bank 210. The battery bank 210 in the present specification refers to a group of the battery cells 211 connected to each other.

A plurality of battery cells 211 are connected to form one battery bank 210 and at least two or more battery banks 210 form the battery pack 200.

Figure 2:
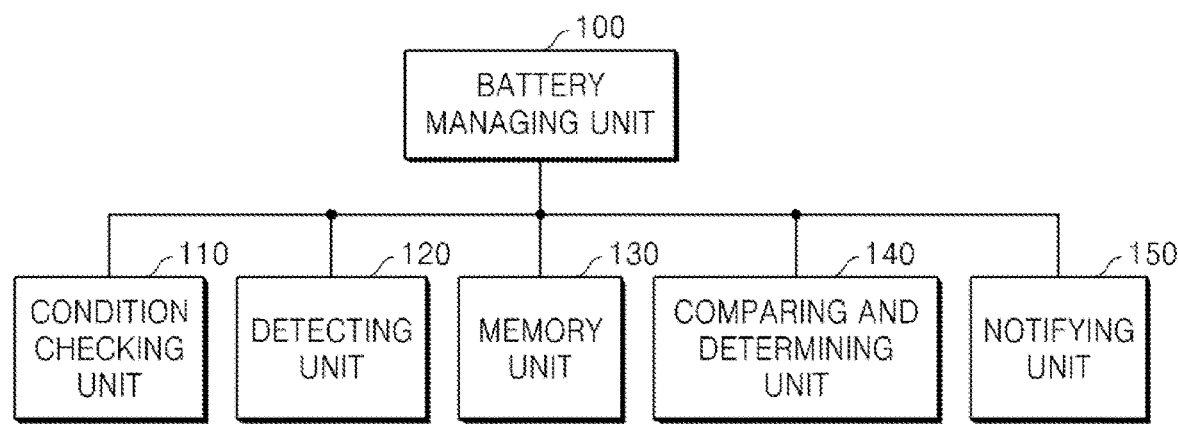
FIG. 2 illustrates a configuration of a battery managing unit 100.

FIG. 2 illustrates a configuration of the battery managing unit 100 according to an embodiment of the present disclosure.

As in FIG. 2, the battery managing unit 100 includes a condition checking unit 110, a detecting unit 120, a memory unit 130, a comparing and determining unit 140, and a notifying unit 150.

The condition checking unit 110 may check a battery cell balancing entry condition. The battery cell balancing entry condition includes checking a charge state of the battery cell 211 and when the battery cell 211 is in a charge state, the cell balancing entry condition is satisfied.

The checking of the charge state is performed by connecting current sensing resistors connected in series to the battery cell 211 and measuring the potential difference between both ends of the battery cell 211. A direction that a current flows in the battery cell 211 is figured out using the measured potential difference and the charge state is checked.

The current sensing resistor has very low resistance used for checking how much current flows through a specific part of the circuit. Since a resistance value thereof is very low, the resistor does not largely disturb the current flow, a current amount in the battery cell 211 may be measured more accurately.

The detecting unit 120 detects the battery bank 210 requiring cell balancing.

The method for detecting the battery bank 210 requiring the cell balancing is achieved by measuring voltages of the battery cells 211 included in each of the battery bank 210 in real time and calculating a voltage deviation for the battery bank 210. Accordingly, when the calculated voltage deviation of the battery bank 210 is equal to or greater than a prescribed reference voltage deviation, it is determined that cell balancing is necessary and the cell balancing may be started for the battery cells 211 included in the battery bank 210 having been detected to require the cell balancing.

When the cell balancing is determined to be started, the voltage deviation of the battery bank 210 having been detected to require the cell balancing and a voltage deviation of the battery bank 210 after termination of the cell balancing are recorded to and stored in the memory unit 130.

The comparing and determining unit 140 receives to compare information about the voltage deviations at the times of start and termination of the cell balancing, which are stored in the memory unit 130. When the cell balancing start voltage deviation is equal to or smaller than the voltage deviation after the cell balancing termination, it is determined that the cell balancing fails, and when the cell balancing start voltage deviation is greater than the voltage deviation after the cell balancing termination, it is determined that the cell balancing is achieved.

When the comparing and determining unit 140 determines that the cell balancing fails, the notifying unit 150 generates notification for notifying the fail and records an RMA.

Figure 3:
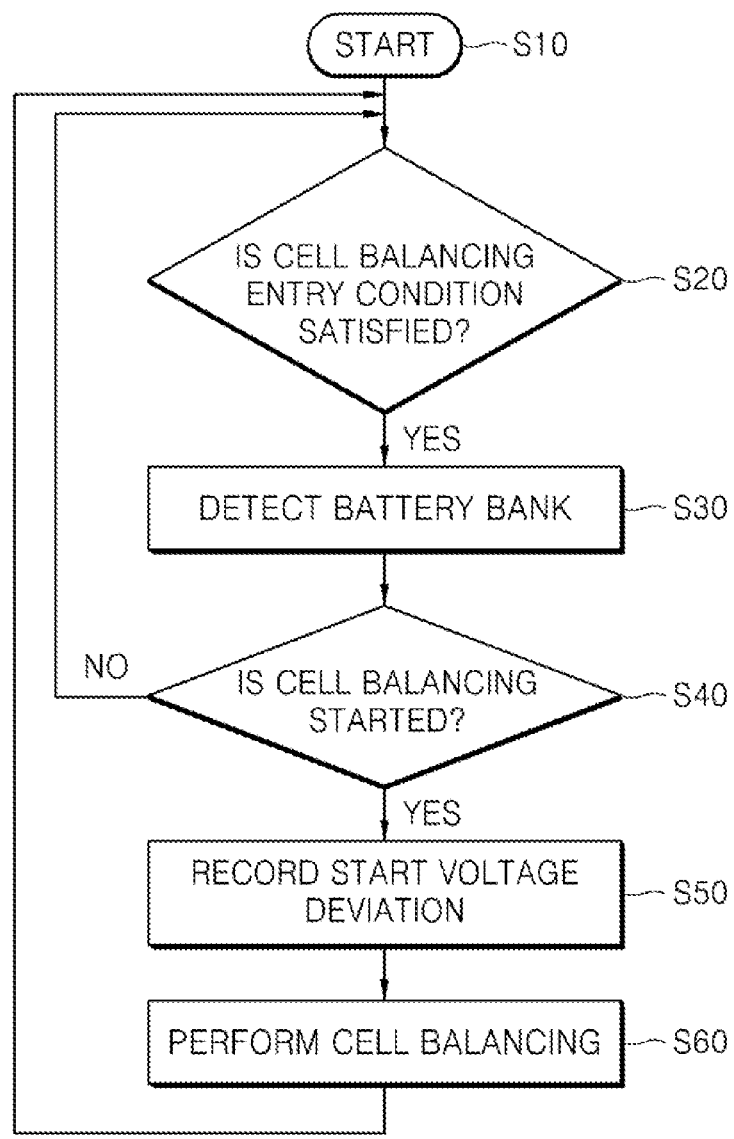
FIG. 3 is a flow chart of an operation performed when a battery cell balancing entry condition is satisfied in accordance with an exemplary embodiment.

FIG. 3 is a flowchart of an operation performed when the battery cell balancing entry condition is satisfied according to an embodiment of the present disclosure.

Referring to FIG. 3, first, a start operation S10 begins. Then an entry condition checking operation S20 is performed in which the battery cell entry condition is checked.

In an entry condition checking operation S20, when the battery cell 211 is in a charge state, the entry condition is satisfied, and when the battery cell 211 is not in the charge state, the entry condition is not satisfied.

A method for checking the charge state of the battery cell 211 is to connect current sensing resistors connected in series to the batter cell 211 and to measure a potential difference between both ends of the battery cell 211. A direction that a current flows in the battery cell 211 is figured out using the measured potential difference to check the charge state.

The current sensing resistors have very low resistance used for checking how much current flows through a specific part of the circuit. Since a resistance value thereof is very low, the resistor does not largely disturb the current flow and a current amount in the battery cell 211 may be measured more accurately.

When the cell balancing entry condition checking operation S20 is satisfied, a battery bank detecting operation S30 is performed in which a battery bank requiring the cell balancing is detected. In the battery bank detecting operation S21, voltages of the battery cells in the battery bank are measured and a voltage deviation for each battery bank is calculated. The calculated voltage deviation for each battery bank is compared with a prescribed reference voltage deviation and a battery bank of which the calculated voltage deviation is greater than the prescribed reference voltage deviation is detected.

The battery bank of which voltage deviation is greater than the prescribed reference voltage deviation is determined to require balancing of battery cells included in the battery bank and then the cell balancing may be performed.

When the battery bank requiring the cell balancing is detected, a cell balancing start operation S40 is performed and the voltage deviation of the battery bank that is detected to require the cell balancing is recorded (operation S23).

On the other hand, when the voltage deviation calculated for each battery bank in the battery bank detecting operation S30 is determined to be equal to or smaller than the prescribed reference voltage deviation and the battery bank requiring the cell balancing is not detected, the cell balancing is not performed and a return to the start operation S10 is performed.

In addition, in an operation S60 in which the cell balancing is performed, a return to the start operation S10 is performed while the cell balancing is performed.

Figure 4:
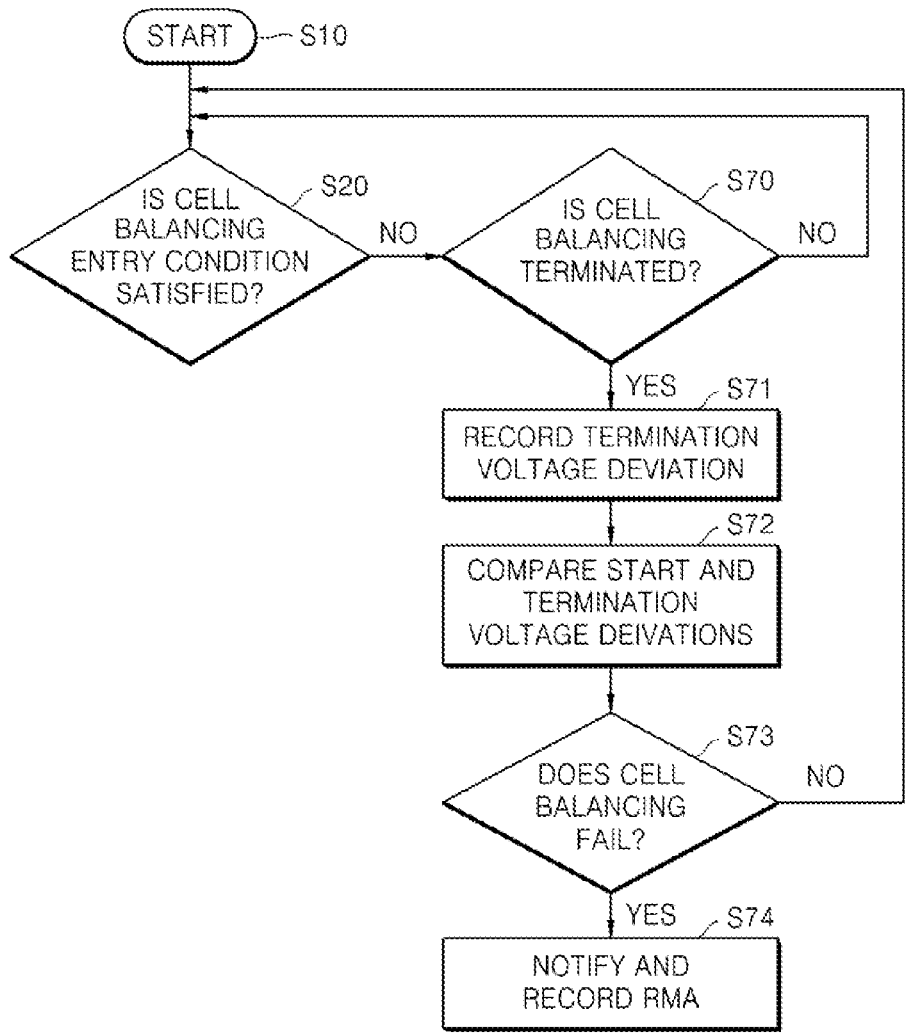
FIG. 4 is a flow chart of an operation performed when the battery cell balancing entry condition is not satisfied.

FIG. 4 is a flowchart of an operation performed when the battery cell balancing entry condition is not satisfied according to an embodiment of the present disclosure.

In an entry condition checking operation S20 in which the battery cell balancing entry condition is checked, when the battery cell is not in a charge state, a cell balancing terminating operation S70 is performed in which the cell balancing is terminated.

In the cell balancing terminating operation S70, voltages of the battery cells 211 included in the battery bank 210 are measured and a voltage deviation is calculated. The calculated voltage deviation is compared with a prescribed reference voltage deviation and when the calculated voltage deviation is equal to or smaller than the prescribed reference voltage deviation, it is determined that the cell balancing is not necessary and the cell balancing is terminated.

On the contrary, when the calculated voltage deviation is greater than the prescribed reference voltage deviation, the cell balancing is determined to be necessary and a return to the start operation S10 is performed.

After the cell balancing is terminated, a termination voltage deviation recording operation S71 is performed in which the voltage deviation of the battery bank 210 on which the cell balancing is performed is recorded. After the recording of the termination voltage deviation, a voltage deviation comparing operation S72 is performed in which the start voltage deviation having been recorded in the start voltage deviation recording operation S50 is compared with the termination voltage deviation having been recorded in the termination voltage deviation recording operation S71.

When the start voltage deviation is smaller than or equal to the termination voltage deviation, it is determined that the cell balancing fails, and when the start voltage deviation is greater than the termination voltage deviation, it is determined that the cell balancing succeeds.

According to the voltage deviation comparison result, whether the cell balancing fails is checked in a cell balancing fail checking operation S73. When it is checked that the start voltage deviation is smaller or equal to the termination voltage deviation, it is determined that the cell balancing fails in the cell balancing fail checking operation S73 and a notification generating and RMA recording operation S74 is performed to generate a notification for notifying the fail and record an RMA.

On the contrary, when it is checked that the start voltage deviation is greater than the termination voltage deviation, it is determined that the cell balancing succeeds in the cell balancing fail checking operation S73 and a return to the start operation S10 is performed.

In addition, after the notification generating and RMA recording operation S74, the termination voltage deviation is compared with a prescribed reference voltage deviation. When the termination voltage deviation is equal to or greater than the prescribed reference voltage deviation, it is determined that the cell balancing may not be performed any more and may be processed as a permanent fail (operation S75).

Furthermore, the voltage deviation is set to the difference between the maximum voltage and the minimum voltage of the battery cells forming the battery bank.

Figure 5:
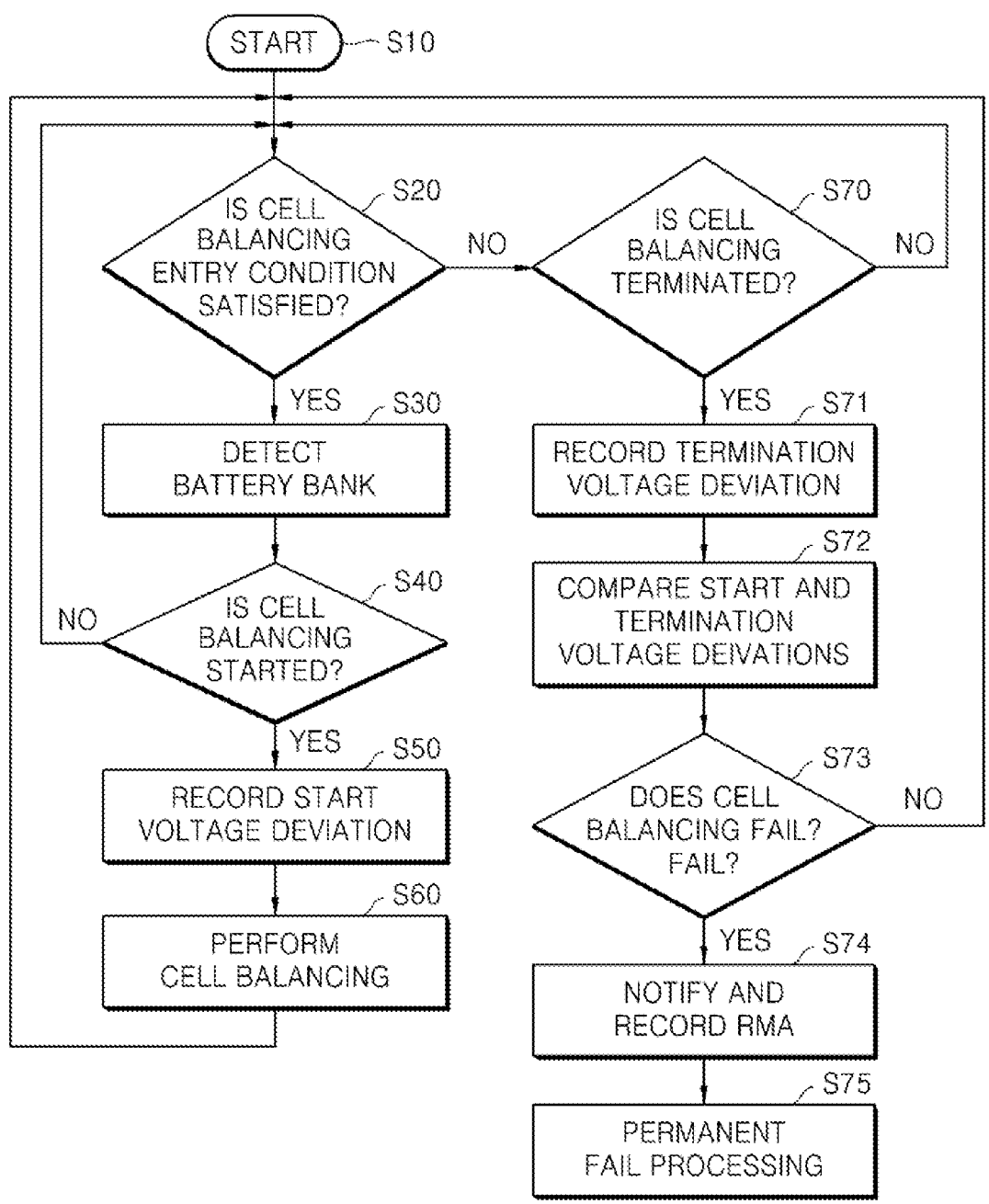
FIG. 5 is an overall flowchart in accordance with another exemplary embodiment.

FIG. 5 is an overall flowchart according to the present disclosure.

An overall operation of the present disclosure will be described in relation to FIG. 5.

The flowchart of the present disclosure starts in a start operation S10. Then an operation S20 of checking a battery cell balancing entry condition is performed. The operation S20 of checking the battery cell balancing entry condition is to check whether the battery cell is in a charge state.

When the battery cell balancing entry condition is satisfied, an operation S30 of detecting a battery bank requiring cell balancing is performed.

On the contrary, when the battery cell is not in the charge state, the cell balancing entry condition is not satisfied and a cell balancing terminating operation S70 is performed.

First, a case where the entry condition is satisfied will be described.

When the operation S30 of detecting the battery bank requiring the cell balancing is performed and it is determined that the battery bank requiring the cell balancing is detected, the battery cell balancing start operation S40 is performed. When the cell balancing starts, a voltage deviation of the battery bank at the start time is recorded (operation S50).

However, in a case where the battery bank requiring the cell balancing is not detected, a return to the start operation S10 is performed.

In the cell balancing performing operation S60, the cell balancing is performed and a return to the start operation S10 is performed.

A description will be provided about an operation performed when the cell balancing entry condition is not satisfied.

When the cell balancing entry condition is not satisfied, the cell balancing terminating operation S70 is performed. In the cell balancing terminating operation S70, when the voltage deviation of the battery cells are equal to or greater than a prescribed reference voltage deviation, it is determined that the cell balancing is necessary and a return to the start operation S10 is performed.

On the contrary, when the voltage deviation of the battery cells is smaller than the prescribed reference voltage deviation, the cell balancing is terminated and a voltage deviation of the battery bank after the cell balancing termination is recorded (operation S71). When the voltage deviation after the cell balancing termination is recorded, the voltage deviation at the start time is compared with the voltage deviation after termination (operation S72), and an operation S73 of checking whether the cell balancing fails is performed.

A scheme for checking whether the cell balancing fails is achieved by determining a failure of the cell balancing and performing a notification generating 15 and RMA recording operation S74, when the voltage deviation at the start time is equal to or smaller than the voltage deviation after termination, and by determining a success of the cell balancing and returning to the start operation S10, when the voltage deviation at the start time is greater than the voltage deviation after termination.

In addition, after the notification generating and RMA recording operation S74 is performed, when the voltage deviation measured after the cell balancing termination is equal to or greater than a prescribed reference voltage deviation, it is determined that the cell balancing may not be performed any more and a permanent failure processing operation S75 may be performed.

Furthermore, the voltage deviation is set to the difference between the maximum voltage and the minimum voltage of the battery cells forming the battery bank.

According to the present disclosure, after the battery cell balancing is performed, the voltage deviation at the cell balancing start time and the voltage deviation at the cell balancing termination time are compared and the comparison result is determined. According to the determination, a notification is generated and the RMA value that is a uniformly amplified output represented by a magnitude is recorded. Therefore, reliability for the battery cell balancing is improved and a proactive measure for an abnormality situation may be possibly performed through monitoring the cell balancing result.

Although the battery cell balancing method and system have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A battery cell balancing method for balancing voltages of battery cells forming at least two or more battery banks comprised in a battery pack, the battery cell balancing method comprising:
    an entry condition checking operation of checking a cell balancing entry condition;
    a battery bank detecting operation of detecting a battery bank requiring cell balancing;
    a cell balancing start operation of starting the cell balancing;
    a start time voltage deviation recording operation of recording a voltage deviation of battery cells comprised in the battery bank detected to require the cell balancing;
    a cell balancing performing operation of performing the cell balancing; and
    a cell balancing terminating operation of terminating the cell balancing,
    wherein the cell balancing terminating operation comprises:
    a termination time voltage deviation recording operation of recording a voltage deviation of the battery cells in the battery bank after the termination of the cell balancing;
    a voltage deviation comparing operation of comparing the voltage deviation of the battery cells recorded in the start time voltage deviation recording operation and the voltage deviation of the battery cells after the termination of the cell balancing; and
    a result checking operation of checking a result of the cell balancing, and
    wherein the result checking operation is performed by determining that the cell balancing fails when the voltage deviation at the cell balancing start time is equal to or smaller than the voltage deviation at the termination time, and generating a notification and recording a robust multi-array average (RMA) value when the cell balancing is determined to fail.

2. The battery cell balancing method of claim 1, wherein the entry condition checking operation is performed such that when the battery cells are in a charge state, the entry condition is satisfied, and when the battery cells are not in the charge state, the entry condition is not satisfied.

3. The battery cell balancing method of claim 1, wherein the battery bank detecting operation is performed such that when the voltage deviation of the battery cells forming the battery bank is equal to or greater than a prescribed reference voltage deviation, it is determined that the cell balancing is necessary.

4. The battery cell balancing method of claim 1, wherein the cell balancing terminating operation is performed when the voltage deviation of the battery cells forming the battery bank is equal to or smaller than a prescribed reference voltage deviation.

5. The battery cell balancing method of claim 1, wherein the voltage deviation is a difference between a maximum voltage and a minimum voltage of the battery cells forming the battery bank.

6. A battery cell balancing system for balancing voltages of battery cells comprised in at least two or more battery banks comprised in a battery pack, the battery cell balancing system comprises:

the battery pack comprising the plurality of battery cells; and a battery managing unit configured to manage battery cell balancing, wherein the battery managing unit comprises:

an entry condition checking unit configured to check a cell balancing entry condition;

a detecting unit configured to detect a battery bank requiring cell balancing;

a memory unit in which a voltage deviation of battery cells in the battery bank at a start time of and after termination of the cell balancing are recorded and stored;

a comparing and determining unit configured to compare the voltage deviations stored in the memory unit to check a result of the cell balancing; and a notifying unit configured to generate a notification according to the cell balancing result from the comparing and determining unit, wherein the comparing and determining unit is configured to compare the voltage deviation at the cell balancing start time and the voltage deviation after the cell balancing termination is stored in the memory unit, and determine that the cell balancing fails, when the voltage deviation at the cell balancing start time is smaller or equal to the voltage deviation after the cell balancing termination, and wherein the memory unit further records a robust multi-array average (RMA) value.

7. The battery cell balancing system of claim 6, wherein the notifying unit generates a notification when it is determined that the cell balancing fails by the comparing and determining unit.

8. The battery cell balancing system of claim 6, wherein the voltage deviation is a difference between a maximum voltage and a minimum voltage of the battery cells forming the battery bank.

* * * * *